United States Patent [19]

Nishino et al.

[11] Patent Number: 5,510,654
[45] Date of Patent: Apr. 23, 1996

[54] SEMICONDUCTOR DEVICE AND METHOD OF FABRICATING SAME

[75] Inventors: Tomoki Nishino; Masashi Takeda, both of Kanagawa, Japan

[73] Assignee: Sony Corporation, Tokyo, Japan

[21] Appl. No.: 460,643

[22] Filed: Jun. 2, 1995

Related U.S. Application Data

[62] Division of Ser. No. 315,619, Sep. 30, 1994.

[30] Foreign Application Priority Data

Oct. 1, 1993 [JP] Japan .................................. 5-269628

[51] Int. Cl.⁶ .................................................. H01L 23/48
[52] U.S. Cl. ............................................. 257/773; 257/786
[58] Field of Search ..................................... 257/773, 786, 257/750

Primary Examiner—Mark V. Prenty
Attorney, Agent, or Firm—Hill, Steadman & Simpson

[57] ABSTRACT

A semiconductor device having any arbitrary size. The number of input/output terminals can be easily and selectively increased while using input/output amplifier circuit functional portions having the same circuit configuration, by using both ball bonding and TAB bonding techniques. Every two (4A, 4B) of the electrodes on the semiconductor device correspond to each one set of input/output amplifier circuits formed by three ones (6A, 6B, 6C) of the input/output amplifier circuits. The spacing $S_1$ between the two electrodes (4A, 4B) corresponding to one set of input/output amplifier circuits is substantially equal to the spacing $S_2$ between the electrode 4B and the adjacent electrode 4C of one adjacent set of input/output amplifier circuits and also to the spacing $S_3$ between the electrode 4A and the adjacent electrode 4D of the other adjacent set of input/output amplifier circuits.

3 Claims, 6 Drawing Sheets

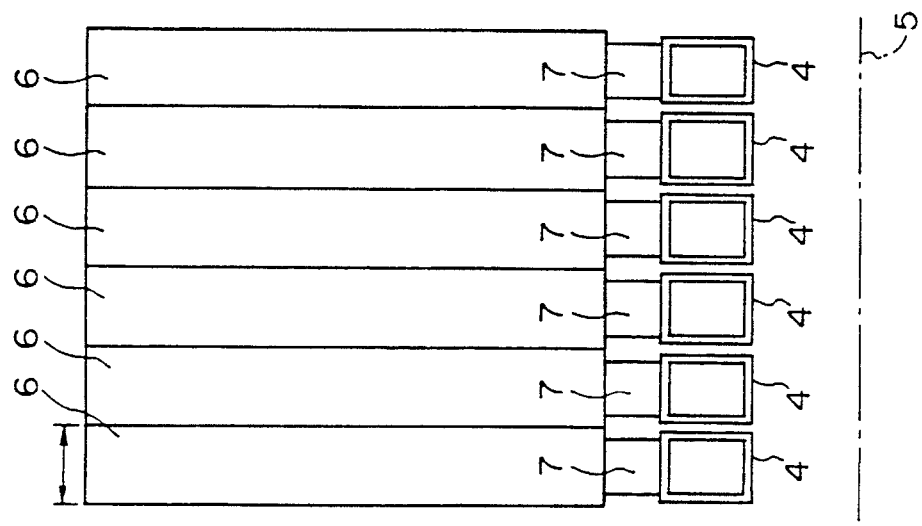
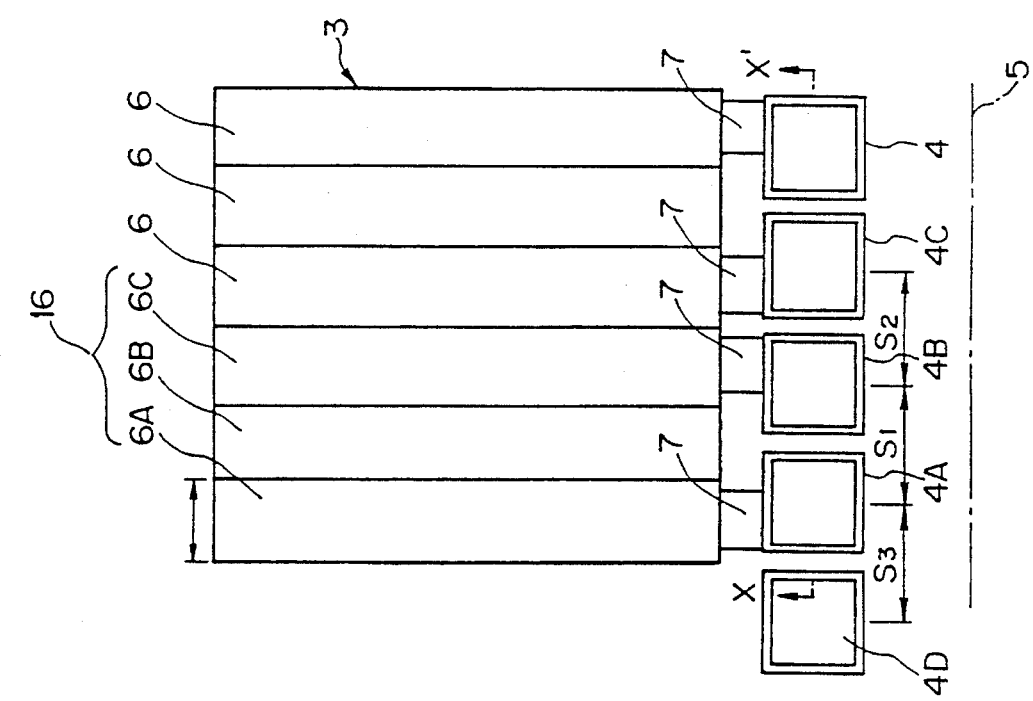

5,510,654

SEMICONDUCTOR DEVICE AND METHOD OF FABRICATING SAME

This is a division of application Ser. No. 08/315,619, filed Sep. 30, 1994.

BACKGROUND OF THE INVENTION

The present invention relates to a semiconductor device having I/O amplifier circuits and electrodes disposed around its fringes and, more particularly, to a logic circuit semiconductor device that needs numerous input/output terminals.

The logic circuit semiconductor device is generally indicated by reference numeral 1 in FIG. 6. Generally, this semiconductor device 1 has the functional portion 2 of a logic circuit, the functional portions 3 of input/output amplifier circuits disposed around the functional portion 2, and electrodes 4 for making connections with an external substrate (not shown).

The electrodes 4 are disposed around fringes of the semiconductor device so as to correspond to their respective input/output amplifier circuits in a 1:1 relation. If necessary, the input/output amplifier circuits are electrically connected with their respective electrodes.

The logic circuit semiconductor device 1 is installed on a package equipped with external terminals which are connected with the external substrate. The device 1 is tied with signal lead lines existing inside the package via the electrodes and is also electrically connected with the external substrate via the external terminals. The logic circuit semiconductor device is connected with the signal lead lines by ball bonding using Au wires or by TAB bonding (tape automated bonding) using TAB tape.

This logic circuit semiconductor device is isolated from other logic circuit semiconductor devices at a scribe center 5. The functional portions 3 of the input/output amplifier circuits are formed by input/output amplifier circuits 6.

In recent years, as semiconductor fabrication technology develops, miniaturization of semiconductor devices has improved greatly. Also, device densities has increased greatly. As a result, it has been possible to fabricate large-scale integrated logic circuitry out of semiconductor devices. As semiconductor device densities are increased, it has been required to offer semiconductor devices which permit one to select the ratios of the numbers of leads and electrodes to the size of the circuit of semiconductor devices according to the sizes of the circuits of the electronic appliance or apparatus from various values.

This tendency is conspicuous in cases of application-specific integrated circuits (ASICs) such as gate arrays and standard cells. Especially, in the case of gate arrays, it is important that semiconductor devices installed on the arrays and connectable electrodes be selected from a wide choice of numbers. Furthermore, it is necessary that the semiconductor devices be inexpensive.

As semiconductor device size has become smaller and device densities have increased, a semiconductor device which forms small-scale circuitry or has small size and which is equipped with numerous connected electrodes has generally been required.

In order to satisfy this requirement, it is important that means for connecting a semiconductor device with signal lines inside a package be made thinner. In particular, fabrication technology for interconnecting small semiconductor elements having numerous electrodes closely spaced from each other and for assembling a semiconductor device, especially up to a molded semiconductor device, using the interconnected elements, is important. In addition, the interconnecting means are required to be economical.

As mentioned previously, in the case of a molded semiconductor device, ball bonding and TAB bonding are generally used to interconnect a semiconductor device having logic circuitry and signal lines inside a package. In the case of a semiconductor device having numerous interconnected electrodes, it is essential to use ball bonding and TAB bonding adequately according to the purpose in order to maintain the performance and to seek for good economy as described below.

We now take a conventional molded semiconductor device as an example. Where interconnections are made by ball bonding, leadframes are installed around a semiconductor device. The front ends of the inner leads of the leadframes are connected with the electrodes formed on top of the semiconductor device by Au wires.

The positional relation between the front ends of the inner leads and the electrodes are physically determined by the number of the leads and by the pitch between the front ends of the leads. Specifically, when the leads are machined, if the pitch between the front ends can be narrowed, then the front ends of the inner leads can be brought closer to the semiconductor device even if the number of the leads is larger. However, the pitch between the front ends can be reduced to about 200 μm at best because of the minimum size achievable by etching techniques or presswork techniques.

Therefore, where a subminiature semiconductor device having numerous electrodes spaced less than 200 μm from each other is connected with an external substrate by Au wires, the inner leads are spaced remotely from the corresponding leads. Consequently, the distance between the electrodes and the front ends of the corresponding inner leads is increased. This increases the lengths of the loops formed by the Au wires.

Where the lengths of the loops formed by the Au wires are increased, the diameter of the Au wires must be increased to prevent them from warping or sagging. On the other hand, in order to connect closely spaced electrodes by ball bonding, the diameter of the Au wires must be reduced. Accordingly, where a small-sized semiconductor device having numerous electrodes spaced less than 200 μm from each other is connected with an external substrate by Au wires, it is necessary to satisfy these two conflicting technical requirements.

Where ball bonding is done, the capillaries of a bonding machine are not permitted to contact adjacent Au wires shaped like nail heads. The capillaries are jigs for crushing a ball formed at the head of each Au wire and shaping the ball into a form resembling a nail head. Therefore, even if an optimum capillary shape is used, it is impossible to increase the Au wire diameter beyond a certain value. Hence, it is impossible to reduce the electrode spacing below a certain value. Because of these conditions, if it is assumed that the minimum achievable wire diameter is about 30 μm, then the minimum achievable electrode spacing is 95 to 100 μm.

Although the loop lengths of Au wires, the electrode spacing, and the pitch between the front ends of the inner electrodes have technical limitations as described above, the greatest advantage of ball bonding is that it is inexpensive. Because of the economy, use of ball bonding is required as long as it can be applied technically.

Meanwhile, where interconnections are made by TAB bonding, the accuracy at which fingers on a TAB film are aligned with bumps formed on electrodes and the accuracy at which they are fabricated are limiting factors. Since dimensional limitations such as the loop lengths of Au wires, the electrode spacing, and the pitch between the front ends of the inner electrodes as encountered in the above-described ball bonding do not exist, the electrode spacing can be reduced down to 60–70 µm.

For this reason, for a subminiature semiconductor device which has electrodes closely spaced from each other and to which the ball bonding cannot be applied, interconnections can be made by TAB bonding. However, the cost is high, because expensive TAB film and bumps must be employed. In consequence, it is necessary that ball bonding and TAB bonding be used properly, depending on the purpose, from technical and economical points of view.

With respect to the circuit arrangements of a semiconductor device, especially the circuit arrangements of ASICs, the functional portions of logic circuits have become smaller and smaller because of development of microminiaturization technology. However, input/output amplifier circuit portions around the functional portions of logic circuits have required the same areas as used in the prior art techniques in order to secure sufficient ability to drive the devices. That is, the input/output amplifier circuit portions cannot be reduced in size though the functional portions of logic circuits become smaller and smaller. This technical gap has grown increasingly.

To permit ball bonding and TAB bonding to be used properly, depending on the purpose, subassemblies each consisting of an input/output amplifier circuit and an electrode must be designed and fabricated separately. This requirement is not permitted in designing and fabrication of ASICs such as gate arrays.

Where it is attempted to permit ball bonding and TAB bonding to be used properly, depending on the purpose, and to arrange electrodes in or on the same semiconductor device with an electrode spacing close to the minimum values achievable by both ball bonding and TAB bonding, it is necessary to determine the size of the semiconductor device with the lowest multiple common to both minimum achievable electrode spacings. This makes it impossible to fabricate semiconductor devices with any arbitrary size.

SUMMARY OF THE INVENTION

In view of the foregoing problems, it is an object of the present invention to provide a semiconductor device which has any arbitrary size and is equipped with circuit configurations forming the functional portions of identical input/output amplifier circuits and which has input/output terminals that can be easily and selectively increased.

It is another object of the invention to provide a method of fabricating a semiconductor device which permits ball bonding and TAB bonding to be used properly, depending on the purpose.

We have conducted researches, taking account of the various conditions described above and have reached the recognition that ball bonding and TAB bonding must be utilized selectively, taking performance and economy into consideration. Ball bonding is economical but needs a relatively large electrode spacing. The TAB bonding technique can be applied to comparatively small electrode spacings but has poor economy. We completed the present invention by contriving a novel electrode arrangement having a minimum achievable electrode spacing permitting application of the ball bonding technique.

The above objects are achieved in accordance with the teachings of the invention by a semiconductor device comprising a logic circuit functional portion and sets of amplifier circuits. Each set of the amplifier circuits consists of three adjacent input/output amplifier circuits arranged parallel to each other. All of these input/output amplifier circuits are disposed around fringes of the logic circuit functional portion. Two electrodes are disposed for two side ones of the input/output amplifier circuits of each set of amplifier circuits. The electrodes are so arranged that the spacing between the aforementioned two electrodes is substantially equal to the spacing between the two adjacent electrodes of any two adjacent amplifier sets. The spacing between electrodes referred to herein means the center-to-center spacing between two adjacent electrodes.

In one preferred embodiment, the width of each input/output amplifier circuit is in excess of 65 µm. The electrodes are composed of one layer of a metal or two layers of metals.

A method of fabricating the above-described semiconductor device comprises the steps of: preparing a semiconductor device substrate on which a logic circuit functional portion master and a plurality of input/output amplifier circuit masters are formed, the input/output amplifier circuit masters being disposed around fringes of the logic circuit functional portion master; selecting either a first patterning step in which two electrodes are placed for two side ones of three adjacent input/output amplifier circuit masters arranged parallel to each other and said electrodes are connected with their respective ones of said input/output amplifier circuits or a second patterning step in which the electrodes are placed such that each one electrode corresponds to one of said input/output amplifier circuits and said electrodes are connected with their respective ones of said input/output amplifier circuits, to form at least one patterned metal layer on said substrate.

Where the first patterning step is selected, the electrodes are connected by ball bonding. Where the second patterning step is selected, the electrodes are connected by TAB bonding. As a result, the electrodes can be connected at an electrode spacing close to the minimum electrode spacing achievable by the interconnection fabrication technique, using the optimum method. Hence, where a semiconductor device equipped with only one specific kind of input/output amplifier circuits is fabricated, interconnects can be made, taking account of the number of required input/output terminals, by a method which is regarded as best in terms of performance and economy.

In one feature of the invention, the minimum width of each input/output amplifier circuit is set to 65 µm. Where ball bonding is utilized, the electrodes can be arranged at a spacing of 98 µm, which is greater than the minimum electrode spacing. Where TAB bonding is exploited, the electrodes can be arranged at a spacing of 65 µm, which is equal to or greater than the minimum electrode spacing. Therefore, by setting the width of each input/output amplifier circuit greater than 65 µm, the number of the input/output terminals can be increased without increasing the area occupied by the functional portions of the input/output amplifier circuits and by the electrodes.

In another feature of the invention, the electrodes are made either from one layer of a metal or from two layers of metals. Thus, the distance between any one of the metal-layer electrodes and adjacent exposed portions of the metal layer or layers can be reduced. As a result, the spacing between the successive electrodes can be diminished.

Other objects and features of the invention will appear in the course of the description thereof, which follows.

BRIEF DESCRIPTION OF THE DRAWINGS

FIGS. 2A and 2B are plan views of input/output amplifier circuits and an electrode pattern, illustrating the second step of the process according to the invention;

DESCRIPTION OF THE PREFERRED EMBODIMENTS

Figure 1:
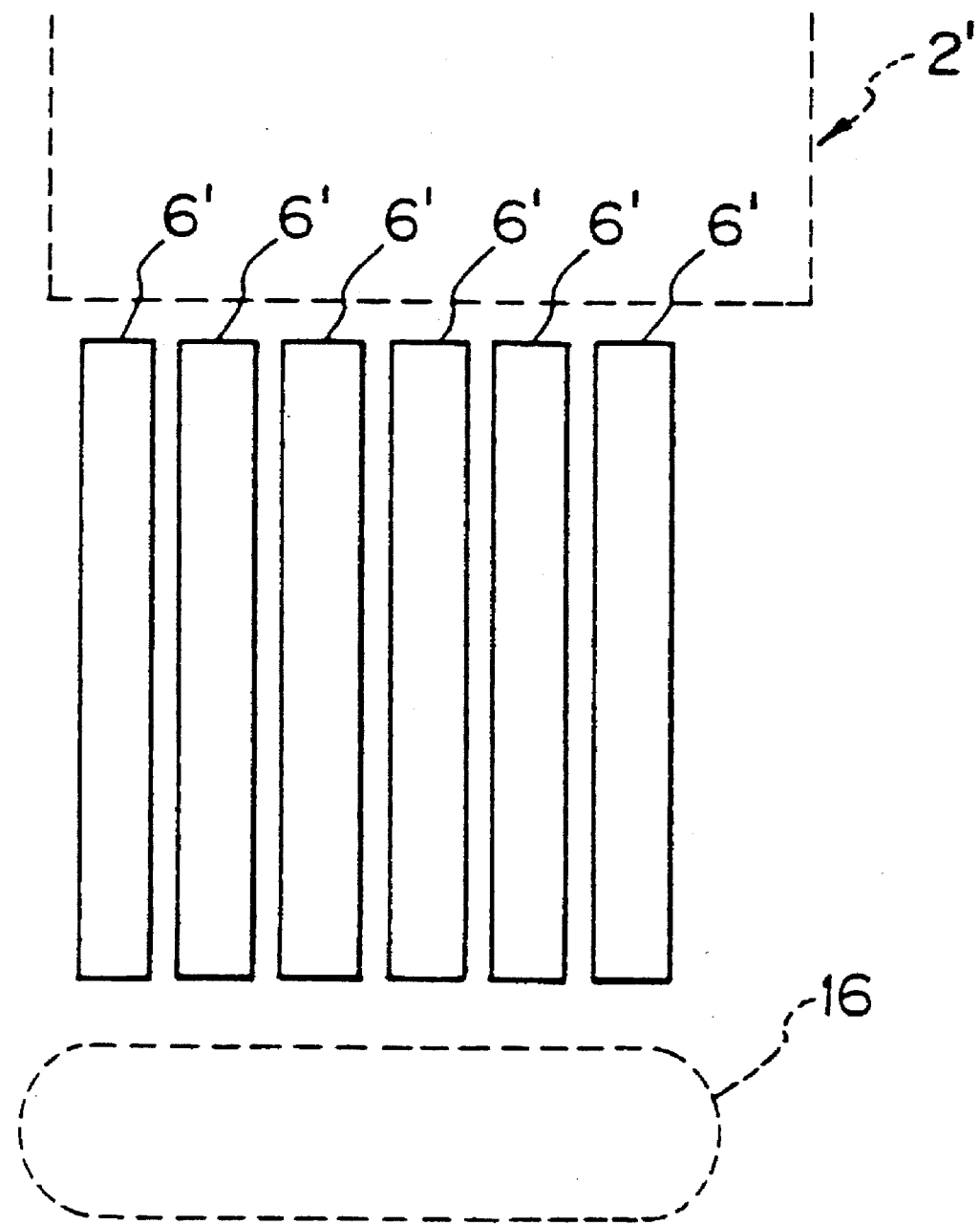
FIG. 1 is a plan view illustrating the first step of a process according to the present invention.

Referring to FIG. 1, a semiconductor device, substrate on which a master 2' for a logic circuit functional portion is formed is prepared. Masters 6' for a plurality of input/output amplifier circuit portions are arranged around fringes of the master 2'. Electrodes are formed in a region 16. Then, either a first metal film-patterning step or a second metal film-patterning step is selected. In the first metal film-patterning step, the semiconductor device substrate is connected with an external substrate by ball bonding which requires a relatively wide electrode spacing. In the second metal film-patterning step, the semiconductor device substrate is connected with an external substrate by TAB bonding techniques which can be applied where the electrode spacing is relatively small. Input/output amplifier circuit portions 6, electrodes 4, and stripes of metal film 7 for interconnecting the circuit portions 6 and the electrodes 4 are formed. Where the first patterning step is selected, the electrode pattern shown in FIG. 2A is formed. Where the second patterning step is selected, the electrode pattern shown in FIG. 2B is formed.

Where the metal film-patterning step for forming the pattern shown in FIG. 2A is selected, the following process is carried out. In FIG. 2A, an input/output circuit amplifier functional portion 3 consists of an assemblage of rectangular input/output amplifier circuits 6 which are arranged in a parallel relation to each other. Each input/output amplifier circuit 6 has a width exceeding 65 μm. Of the electrodes 4, 4A, 4B, etc., two electrodes 4A and 4B correspond to one set 16 of input/output amplifier circuits consisting of three input/output amplifier circuits 6A, 6B, and 6C. The electrodes are so arranged that the spacing S1 between the adjacent electrodes 4A and 4B corresponding to the same set is substantially equal to the spacing $S_2$ between the electrode 4B and the adjacent electrode 4C corresponding to one adjacent set of input/output amplifier circuits and also to the spacing $S_3$ between the electrode 4A and the adjacent electrode 4D corresponding to the other adjacent set of input/output amplifier circuits. The stripes of metal film 7 are connected with two input/output amplifier circuits 6A and 6B of these three input/output amplifier circuits. In this structure, each input/output amplifier circuits have a width greater than 65 μm. Therefore, the electrodes can be arrayed at a spacing that enables both ball bonding and TAB bonding to be used.

Figure 3A:
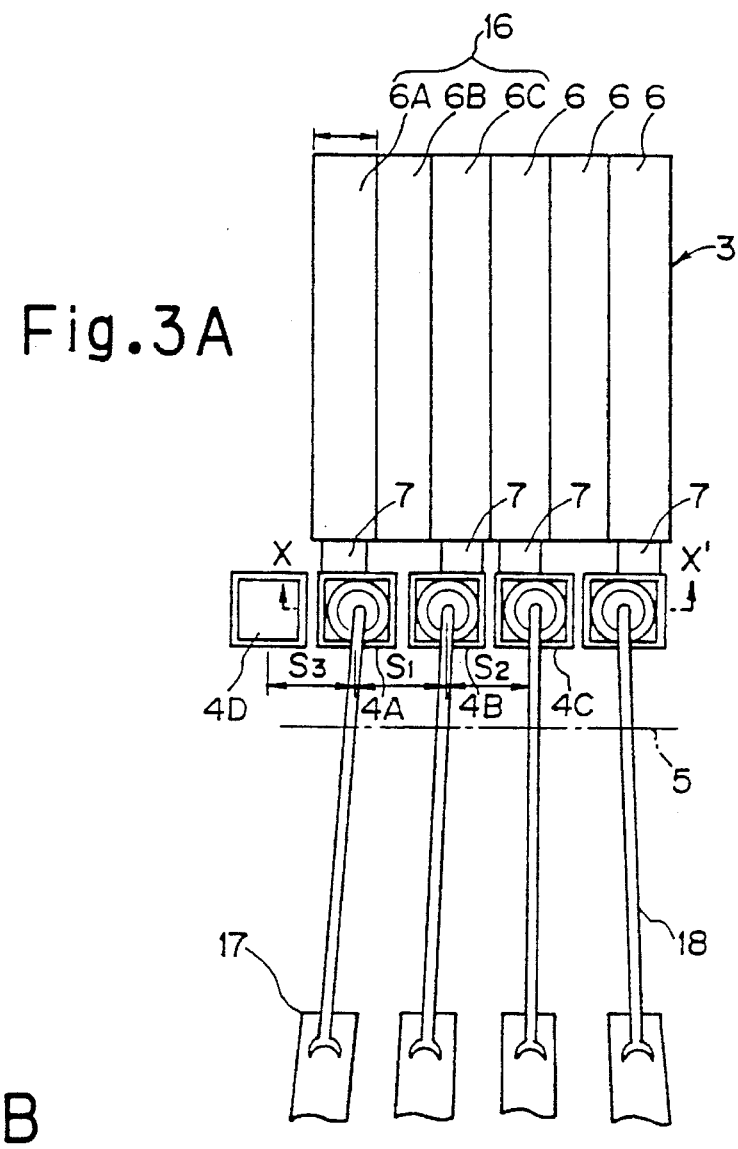
FIG. 3A is a plan view illustrating a step carried out subsequently to the step illustrated in FIG. 2A.
Figure 3B:
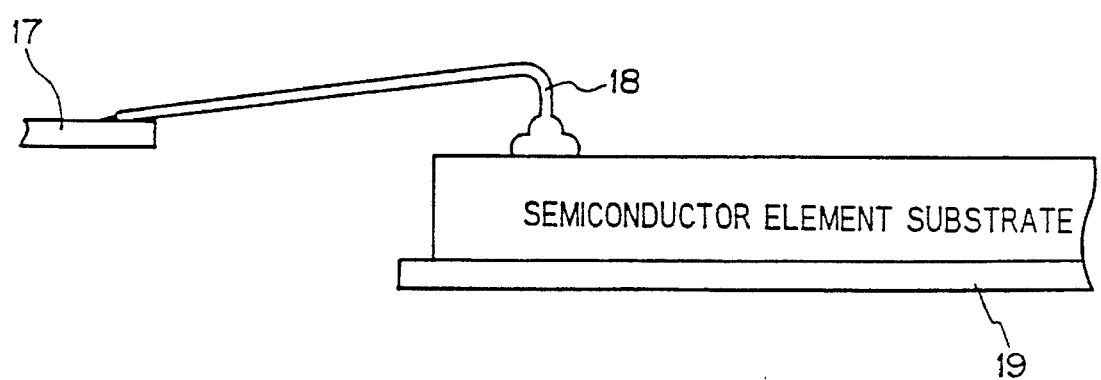
FIG. 3B is a cross-sectional view of the semiconductor device substrate shown in FIG. 3A.

The semiconductor device patterned as shown in FIG. 2A in this way undergoes a bonding step illustrated in FIGS. 3A and 3B, where leadframes 17, gold wires 18, and a die pad 19 are shown. The electrodes 4A–4C are connected with the leadframes 17 for an external substrate by the gold wires 18. Assuming that the input/output amplifier circuits have a width of 70 μm, the spacing between the electrodes 4, 4A, 4B, etc. shown in FIG. 2A is 105 μm. Since the electrode spacing is greater than minimum electrode spacings of 95–100 μm achievable by ball bonding techniques, the electrodes can be connected by ball bonding. Furthermore, the area occupied by the electrodes 4, 4A, etc. is reduced to a minimum as long as the ball bonding techniques are employed. In other words, the most electrodes can be positioned in the same area as long as ball bonding techniques are used.

Where the metal film-patterning step illustrated in FIG. 2B is selected, the following process is carried out. Electrodes 4, 4A, 4B, etc. are positioned for input/output amplifier circuits 6 such that each one electrode corresponds to one input/output amplifier circuit. The input/output amplifier circuits are connected with their respective electrodes 4, 4A, 4B, etc. by metal film 7.

Figure 4A:
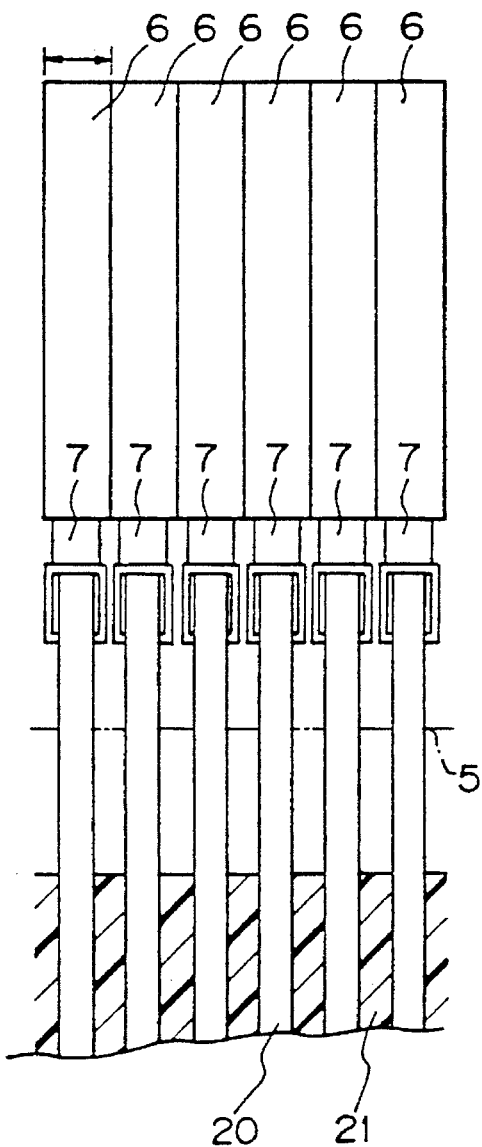
FIG. 4A is a plan view illustrating a step carried out subsequently to the step illustrated in FIG. 2B.
Figure 4B:
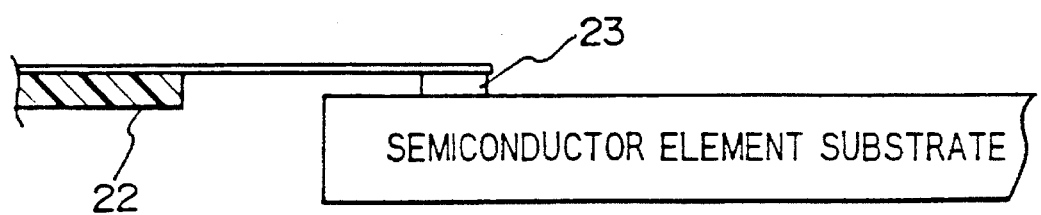
FIG. 4B is a cross-sectional view of the semiconductor device substrate shown in FIG. 4A.

The semiconductor device patterned as shown in FIG. 2B in this way undergoes a TAB (tape automated bonding) step illustrated in FIGS. 4A and 4B, where leads 20, insulating film 21, TAB tape 22, and a gold bump 23 are shown. The TAB tape is stuck on the insulating film. The leads are bonded to the top surface of the TAB tape. The electrode portions of the semiconductor device are placed in position relative to the front ends of the leads and bonded to the front ends of the leads with the gold bump by thermo compression. In this way, connections are made. The spacing between the electrodes 4, 4A, 4B, etc. shown in FIG. 2B is 70 μm, which is greater than minimum electrode spacings of 60–70 μm achievable by TAB bonding. Therefore, connections can be made by TAB bonding.

Figure 5:
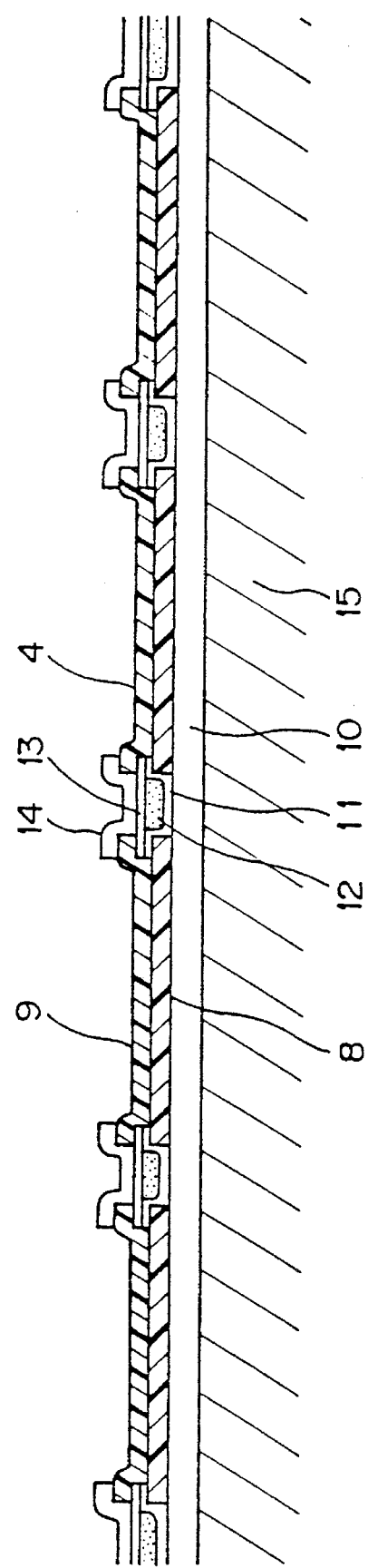
FIG. 5 is a cross-sectional view of an electrode structure of a semiconductor device according to the invention, taken on line X—X' of FIG. 2A.
Figure 6:
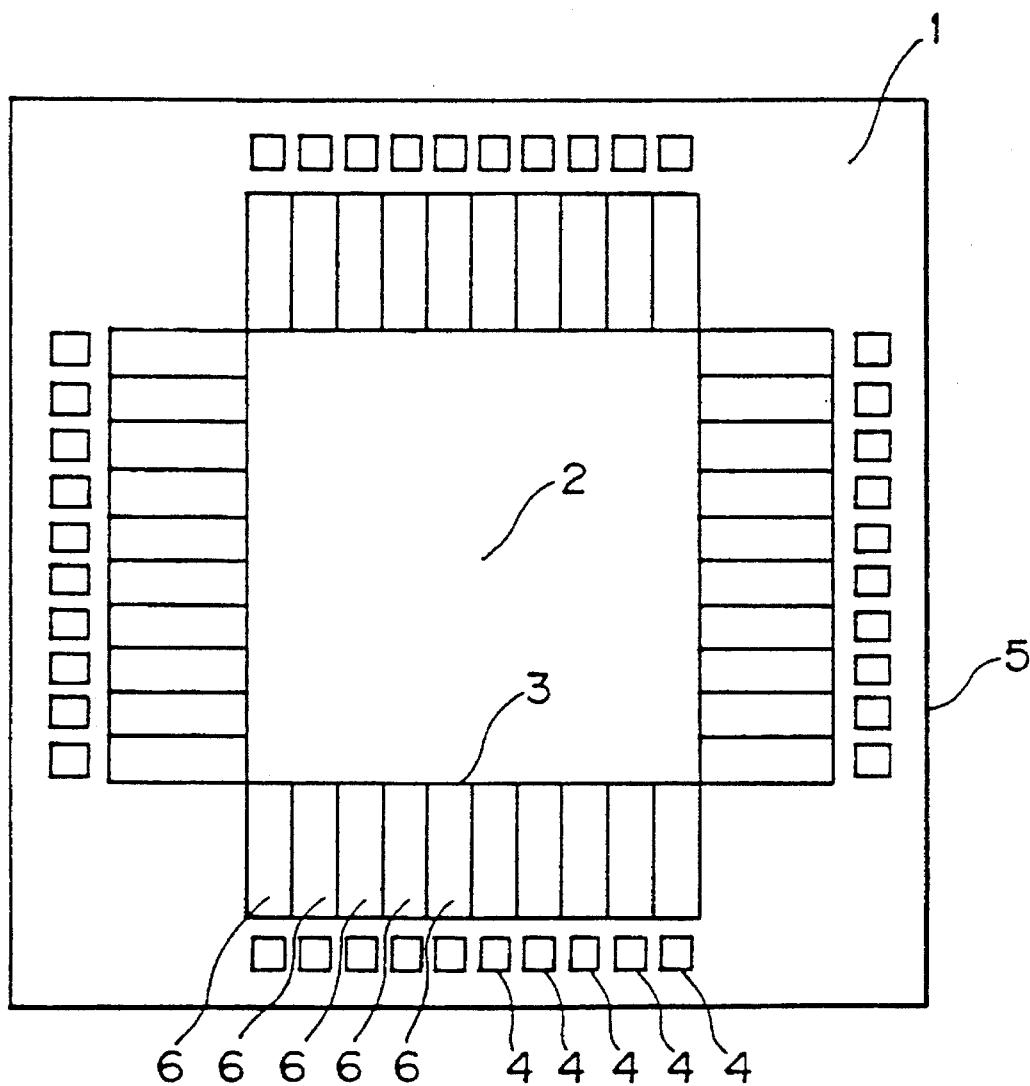
FIG. 6 is a schematic plan view of the whole semiconductor device which is partially shown in FIG. 5.

FIG. 5 is a cross-sectional view taken on line X—X' of FIG. 2A, showing the electrode structure of a semiconductor device according to the invention. Each electrode 4 comprises a first metal film 8 and an overlying second metal film 9. A bottom film 10 exists under the second metal film 9. The portions located between the successive electrodes 4 are each composed of a first protective film 11 on the bottom film 10, a second protective film 12 formed on the first film 11, a third protective film 13 formed on the second film 12, and a fourth protective film that is a final protective film. The first metal film 8 and the second metal film 9 have the same dimensions. The first protective film 11 and the fourth protective film 14 are provided with openings of the same dimensions. Indicated by numeral 15 is a silicon substrate.

In this structure, the amount by which the first protective film 11 overlaps the first metal film 8 and the amount by which the fourth protective film 14 overlaps the second metal layer 9 can be minimized. Therefore, the gaps between the successive electrodes 4 can be narrowed. Hence, more input/output amplifier circuits 6 and more electrodes 4 can be arrayed by minimizing the spacing between the successive electrodes 4. Obviously, the same advantage can be obtained if only one metal film is formed.

In fabricating the semiconductor device shown in FIG. 1 or the semiconductor device shown in FIG. 2A or 2B, the inventive method selects either the pattern shown in FIG. 1 or the pattern shown in FIG. 2A or 2B. Where the pattern shown in FIG. 1 is selected, bonding is effected by ball bonding. Where the pattern shown in FIG. 2A or 2B is selected, bonding is done by TAB bonding. In this way, the number of input/output terminals of the same semiconductor device of arbitrary size can be easily and selectively increased by the use of functional portions of input/output amplifier circuits having the same circuit configuration. Additionally, this fabrication method can be applied to designing and manufacture of ASICs such as gate arrays.

What is claimed is:

1. A semiconductor device comprising:

a logic circuit functional portion;

a plurality of input/output amplifier circuits disposed around fringes of said logic circuit functional portion;

sets of input/output amplifier circuits, each set being formed by three adjacent ones of said input/output amplifier circuits arranged in parallel to each other; and electrodes each two of which are disposed for each set of input/output amplifier circuits, said two electrodes corresponding to the same set being spaced apart a distance substantially equal to a distance by which adjacent electrodes of adjacent ones of said sets of input/output amplifier circuits are spaced apart.

2. The semiconductor device of claim 1, wherein each of said input/output amplifier circuits has a width exceeding 65 μm.

3. The semiconductor device of claim 1, wherein said electrodes are made from one layer of a metal or two layers of metals.

* * * * *